(12) United States Patent
Rosen

(10) Patent No.: US 7,743,300 B1
(45) Date of Patent: *Jun. 22, 2010

(54) INTEGRATED CIRCUIT TEST USING CLOCK SIGNAL MODIFICATION

(75) Inventor: Eitan Rosen, Abirim (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 12/291,177

(22) Filed: Nov. 6, 2008

Related U.S. Application Data

(63) Continuation of application No. 10/614,403, filed on Jul. 7, 2003, now Pat. No. 7,461,304.

(51) Int. Cl.
*G01R 31/28* (2006.01)
*G06F 11/00* (2006.01)
*H03K 19/00* (2006.01)

(52) U.S. Cl. .................. 714/731; 714/744; 326/93

(58) Field of Classification Search .............. 714/731, 714/744; 326/93
See application file for complete search history.

(56) References Cited

U.S. PATENT DOCUMENTS

| | | | |
|---|---|---|---|
| 4,479,216 A * | 10/1984 | Krambeck et al. ............ 714/814 |
| 4,893,072 A | 1/1990 | Matsumoto |
| 5,053,698 A | 10/1991 | Ueda |
| 5,099,196 A | 3/1992 | Longwell et al. |
| 5,325,369 A | 6/1994 | Kim |
| 5,455,931 A | 10/1995 | Camporese et al. |
| 5,489,864 A | 2/1996 | Ashuri |
| 5,497,263 A | 3/1996 | Masuda et al. |
| 5,652,530 A | 7/1997 | Ashuri |
| 5,705,942 A | 1/1998 | Ashuri |
| 5,761,097 A | 6/1998 | Palermo |
| 5,936,867 A | 8/1999 | Ashuri |
| 6,059,836 A | 5/2000 | Liguori |
| 6,071,003 A | 6/2000 | Ashuri et al. |
| 6,204,694 B1 | 3/2001 | Sunter et al. |
| 6,239,627 B1 * | 5/2001 | Brown et al. ............... 327/116 |
| 6,266,749 B1 | 7/2001 | Hashimoto et al. |
| 6,463,570 B1 | 10/2002 | Dunn et al. |
| 6,467,044 B1 * | 10/2002 | Lackey ..................... 713/501 |
| 6,473,725 B1 | 10/2002 | Schoelikopf et al. |
| 6,734,703 B1 * | 5/2004 | Alfke et al. ................ 326/38 |
| 7,191,368 B1 * | 3/2007 | Organ et al. ................ 714/57 |

(Continued)

OTHER PUBLICATIONS

"Reducing test application time and power dissipation for scan-based testing via multiple clock disabling" by Kuen-Jong Lee, Jih-Jeen Chen This paper appears in: Test Symposium, 2002. (ATS '02). Proceedings of the 11th AsianPublication Date: Nov. 18-20, 2002 On pp. 338-343 ISSN: 1081-7735 ISBN: 0-7695-1825-7 INSPEC Accession No. 7626.*

(Continued)

*Primary Examiner*—Cynthia Britt

(57) ABSTRACT

An integrated circuit includes a test signal generator that receives a clock signal including pulses having leading edges and trailing edges that occur at predetermined intervals and selectively generates a modified clock signal by adjusting timing of at least one of the leading and trailing edges of at least one of the pulses. A signal path includes a circuit and receives one of the clock signal and the modified clock signal from the test signal generator.

20 Claims, 12 Drawing Sheets

U.S. PATENT DOCUMENTS

2003/0115524 A1* 6/2003 Johnston et al. ............. 714/726

OTHER PUBLICATIONS

"High-frequency, at-speed scan testing" by Xijiiang Lin et al. This paper appears in: Design & Test of Computers, IEEE Publication Date: Sep.-Oct. 2003 vol. 20, Issue: 5 On pp. 17-25 ISSN: 0740-7475 INSPEC Accession No. 7758178.*

"Partial scan designs without using a separate scan clock" by Kwang-Ting Cheng This paper appears in: VLSI Test Symposium, 1995. Proceedings., 13th IEEE Publication Date: Apr. 30-May 3, 1995 On pp. 277-282 ISBN: 0-8186-7000-2 INSPEC Accession No. 5153471.*

USPTO Non-Final Office Action mailed Nov. 30, 2005 for U.S. Appl. No. 10/614,403, filed Jul. 7, 2003.

Amendment and Petition for Extension of Time filed Mar. 9, 2006 in response to USPTO Non-Final Office Action mailed Nov. 30, 2005 for U.S. Appl. No. 10/614,403, filed Jul. 7, 2003.

USPTO Final Office Action mailed Apr. 17, 2006 for U.S. Appl. No. 10/614,403, filed Jul. 7, 2003.

Preliminary Amendment and Petition for Extension of Time filed Aug. 17, 2006 in response to USPTO Final Office Action mailed Apr. 17, 2006 for U.S. Appl. No. 10/614,403, filed Jul. 7, 2003.

USPTO Non-Final Office Action mailed Nov. 17, 2006 for U.S. Appl. No. 10/614,403, filed Jul. 7, 2003.

Response filed Feb. 19, 2007 in response to USPTO Non-Final Office Action mailed Nov. 17, 2006 for U.S. Appl. No. 10/614,403, filed Jul. 7, 2003.

USPTO Final Office Action mailed May 8, 2007 for U.S. Appl. No. 10/614,403, filed Jul. 7, 2003.

Pre-Appeal Brief Request for Review and Petition for Extension of Time filed Sep. 10, 2007 in response to USPTO Final Office Action mailed May 8, 2007 for U.S. Appl. No. 10/614,403, filed Jul. 7, 2003.

Pre-Appeal Brief Request for Review and Petition for Extension of Time filed Sep. 13, 2007 in response to USPTO Final Office Action mailed May 8, 2007 for U.S. Appl. No. 10/614,403, filed Jul. 7, 2003.

USPTO Non-Final Office Action mailed Jan. 10, 2008 for U.S. Appl. No. 10/614,403, filed Jul. 7, 2003.

Amendment filed Apr. 10, 2008 in response to USPTO Non-Final Office Action mailed Jan. 10, 2008 for U.S. Appl. No. 10/614,403, filed Jul. 7, 2003.

* cited by examiner

INTEGRATED CIRCUIT TEST USING CLOCK SIGNAL MODIFICATION

CROSS-REFERENCE TO RELATED APPLICATIONS

This application is a continuation of U.S. application Ser. No. 10/614,403, filed Jul. 7, 2003. The disclosure of the above application is incorporated herein by reference in its entirety.

BACKGROUND

The present invention relates generally to testing integrated circuits. More particularly, the present invention relates to integrated circuit test using clock signal modification.

SUMMARY

In general, in one aspect, the invention features an apparatus for testing an integrated circuit comprising a plurality of clocked storage elements each having a clock input, wherein the clocked storage elements are interconnected by a plurality of signal paths, the apparatus comprising a control circuit adapted to provide a control signal; and a signal generator adapted to receive a first clock signal comprising k pulses each having a first duration, change the duration of each of m of the pulses to a second duration in response to the control signal, wherein m<k and the second duration is not substantially equal to the first duration, to produce a second clock signal, and apply the second clock signal to the clock inputs of the plurality of clocked storage elements.

Particular implementations can include one or more of the following features. Implementations comprise a clock circuit adapted to provide the clock signal. Implementations comprise a measurement circuit adapted to measure a signal generated by the integrated circuit in response to the second clock signal. Implementations comprise a comparison circuit adapted to compare the signal generated by the integrated circuit to a predicted signal to obtain a test result. Implementations comprise an analysis circuit adapted to identify one of the signal paths as flawed based on the test result. The signal generator is further adapted to change the duration of every nth pulse of the signal to the second duration to produce the second clock signal; and successively apply the second clock signal at n different predetermined phases to the clock inputs of the clocked storage elements, wherein each of the predetermined phases is offset from another of the predetermined phases by a period of the second clock signal. The comparison circuit is further adapted to compare the signal generated by the integrated circuit to the predicted signal n times, each time corresponding to one of the n different predetermined phases; and wherein the analysis circuit identifies at least one of the n different predetermined phases as a failure phase. The signal generator is further adapted to apply the failure phase of the second clock signal to the clock inputs of the clocked storage elements during a first predetermined portion of a test time; wherein the comparison circuit is further adapted to compare values stored in the clocked storage elements to predicted values; and wherein the signal generator is further adapted to apply the failure phase of the second clock signal to the clock inputs of the clocked storage elements during a second predetermined portion of the first predetermined portion of the test time when the values stored in the clocked storage elements are not equal to the predicted values. The comparison circuit is further adapted to compare a value stored by one of the clocked storage elements to a corresponding one of the predicted values; and wherein the analysis circuit is further adapted to identify as flawed one of the signal paths connected to the one of the clocked storage elements when the value stored by the one of the clocked storage elements is not equal to the corresponding one of the predicted values. The comparison circuit is further adapted to compare the value stored by a further one of the clocked storage elements to a further corresponding one of the predicted values, wherein the value stored by the one of the clocked storage elements is a function of the value stored by the further one of the clocked storage elements; and wherein the analysis circuit is further adapted to identify as flawed one of the signal paths connected to the one of the clocked storage elements and the further one of the clocked storage elements when the value stored by the further one of the clocked storage elements is not equal to the further corresponding one of the predicted values. The one of the clocked storage elements is part of a scan chain; and wherein the measurement circuit is further adapted to shift the contents of the scan chain from the integrated circuit to the measurement circuit.

In general, in one aspect, the invention features a method, apparatus, and computer program for testing an integrated circuit comprising a plurality of clocked storage elements each having a clock input, wherein the clocked storage elements are interconnected by a plurality of signal paths. It comprises receiving a first clock signal comprising k pulses each having a first duration; changing the duration of each of m of the pulses to a second duration in response to the control signal, wherein m<k and the second duration is not substantially equal to the first duration, to produce a second clock signal; and applying the second clock signal to clock inputs of a plurality of clocked storage elements interconnected by a plurality of signal paths in a circuit.

Particular implementations can include one or more of the following features. Implementations comprise measuring a signal generated by the integrated circuit in response to the second clock signal. Implementations comprise comparing the signal generated by the integrated circuit to a predicted signal to obtain a test result. Implementations comprise identifying one of the signal paths as flawed based on the test result. Changing the duration of m of the pulses comprises changing the duration of every nth pulse of the signal to the second duration to produce the second clock signal; and wherein applying the second clock signal to the clock inputs of the clocked storage elements comprises successively applying the second clock signal at n different predetermined phases to the clock inputs of the clocked storage elements, wherein each of the predetermined phases is offset from another of the predetermined phases by a period of the second clock signal. n=2. Comparing the signal generated by the integrated circuit to the predicted signal comprises comparing the signal generated by the integrated circuit to the predicted signal n times, each time corresponding to one of the n different predetermined phases; and wherein identifying one of the signal paths as flawed comprises identifying at least one of the n different predetermined phases as a failure phase. Identifying one of the signal paths as flawed further comprises searching a predetermined test time, comprising (a) applying the failure phase of the second clock signal to the clock inputs of the clocked storage elements during a first predetermined portion of the test time, (b) comparing values stored in the clocked storage elements to predicted values, and (c) applying the failure phase of the second clock signal to the clock inputs of the clocked storage elements during a second predetermined portion of the first predetermined portion of the test time when the values stored in the clocked storage elements in step (b) are not equal to the predicted values. Identifying one of the signal paths as flawed further comprises comparing a value stored by one of the clocked storage elements to a corresponding one of the predicted values; and identifying as flawed one of the signal paths connected to the one of the clocked storage elements when the value stored by the one of the clocked storage elements is not equal to the corresponding one of the predicted values. Identifying as flawed one of the signal paths further comprises comparing the value stored by a further one of the clocked storage elements to a further corresponding one of the predicted values, wherein the value stored by the one of the clocked storage elements is a function of the value stored by the further one of the clocked storage elements; and identifying as flawed one of the signal paths connected to the one of the clocked storage elements and the further one of the clocked storage elements when the value stored by the further one of the clocked storage elements is not equal to the further corresponding one of the predicted values. The one of the clocked storage elements is part of a scan chain, further comprising shifting the contents of the scan chain from the integrated circuit to the measurement circuit.

In general, in one aspect, the invention features an apparatus for testing an integrated circuit comprising a plurality of clocked storage elements each having a clock input, wherein the clocked storage elements are interconnected by a plurality of signal paths, the apparatus comprising a control circuit adapted to provide a control signal; and a signal generator adapted to produce a clock signal comprising j pulses each having the first duration and m pulses having a second duration in response to the control signal, wherein k=m+j, and wherein the second duration is not substantially equal to the first duration, to produce a clock signal, and apply the clock signal to the clock inputs of the plurality of clocked storage elements.

Particular implementations can include one or more of the following features. Implementations comprise a measurement circuit adapted to measure a signal generated by the integrated circuit in response to the clock signal. Implementations comprise a comparison circuit adapted to compare the signal generated by the integrated circuit to a predicted signal to obtain a test result. Implementations comprise an analysis circuit adapted to identify one of the signal paths as flawed based on the test result. Implementations comprise wherein m=nj and every pulse of the clock signal having the first duration is followed by n pulses having the second duration; and wherein the signal generator is further adapted to successively apply the clock signal at n different predetermined phases to the clock inputs of the clocked storage elements, wherein each of the predetermined phases is offset from another of the predetermined phases by a period of the clock signal. n=2. The comparison circuit is further adapted to compare the signal generated by the integrated circuit to the predicted signal n times, each time corresponding to one of the n different predetermined phases; and wherein the analysis circuit identifies at least one of the n different predetermined phases as a failure phase. The signal generator is further adapted to apply the failure phase of the clock signal to the clock inputs of the clocked storage elements during a first predetermined portion of a test time; wherein the comparison circuit is further adapted to compare values stored in the clocked storage elements to predicted values; and wherein the signal generator is further adapted to apply the failure phase of the clock signal to the clock inputs of the clocked storage elements during a second predetermined portion of the first predetermined portion of the test time when the values stored in the clocked storage elements are not equal to the predicted values. The comparison circuit is further adapted to compare a value stored by one of the clocked storage elements to a corresponding one of the predicted values; and wherein the analysis circuit is further adapted to identify as flawed one of the signal paths connected to the one of the clocked storage elements when the value stored by the one of the clocked storage elements is not equal to the corresponding one of the predicted values. The comparison circuit is further adapted to compare the value stored by a further one of the clocked storage elements to a further corresponding one of the predicted values, wherein the value stored by the one of the clocked storage elements is a function of the value stored by the further one of the clocked storage elements; and wherein the analysis circuit is further adapted to identify as flawed one of the signal paths connected to the one of the clocked storage elements and the further one of the clocked storage elements when the value stored by the further one of the clocked storage elements is not equal to the further corresponding one of the predicted values. The one of the clocked storage elements is part of a scan chain; and wherein the measurement circuit is further adapted to shift the contents of the scan chain from the integrated circuit to the measurement circuit.

In general, in one aspect, the invention features a method, apparatus, and computer program for testing an integrated circuit comprising a plurality of clocked storage elements each having a clock input, wherein the clocked storage elements are interconnected by a plurality of signal paths. It comprises receiving a control signal; producing a clock signal comprising k pulses including j pulses each having a first duration and m pulses having a second duration in response to the control signal, wherein k=m+j, and wherein the second duration is not substantially equal to the first duration; and applying the clock signal to the clock inputs of the plurality of clocked storage elements. Implementations comprise measuring a signal generated by the integrated circuit in response to the clock signal. Implementations comprise comparing the signal generated by the integrated circuit to a predicted signal to obtain a test result. Implementations comprise identifying one of the signal paths as flawed based on the test result. m=nj and every pulse of the clock signal having the first duration is followed by n pulses having the second duration; and wherein applying the clock signal to the clock inputs of the clocked storage elements comprises successively applying the clock signal at n different predetermined phases to the clock inputs of the clocked storage elements, wherein each of the predetermined phases is offset from another of the predetermined phases by a period of the clock signal. n=2. Comparing the signal generated by the integrated circuit to the predicted signal comprises comparing the signal generated by the integrated circuit to the predicted signal n times, each time corresponding to one of the n different predetermined phases; and wherein identifying one of the signal paths as flawed comprises identifying at least one of the n different predetermined phases as a failure phase. Identifying one of the signal paths as flawed further comprises searching a predetermined test time, comprising (a) applying the failure phase of the clock signal to the clock inputs of the clocked storage elements during a first predetermined portion of the test time, (b) comparing values stored in the clocked storage elements to predicted values, and (c) applying the failure phase of the clock signal to the clock inputs of the clocked storage elements during a second predetermined portion of the first predetermined portion of the test time when the values stored in the clocked storage elements in step (b) are not equal to the predicted values. Identifying one of the signal paths as flawed further comprises comparing a value stored by one of the clocked storage elements to a corresponding one of the predicted values; and identifying as flawed one of the signal paths connected to the one of the clocked storage elements when the value stored by the one of the clocked storage elements is not equal to the corresponding one of the predicted values. Identifying as flawed one of the signal paths further comprises comparing the value stored by a further one of the clocked storage elements to a further corresponding one of the predicted values, wherein the value stored by the one of the clocked storage elements is a function of the value stored by the further one of the clocked storage elements; and identifying as flawed one of the signal paths connected to the one of the clocked storage elements and the further one of the clocked storage elements when the value stored by the further one of the clocked storage elements is not equal to the further corresponding one of the predicted values. The one of the clocked storage elements is part of a scan chain, further comprising shifting the contents of the scan chain from the integrated circuit to the measurement circuit.

The details of one or more implementations are set forth in the accompanying drawings and the description below. Other features will be apparent from the description and drawings, and from the claims.

Figure 1:
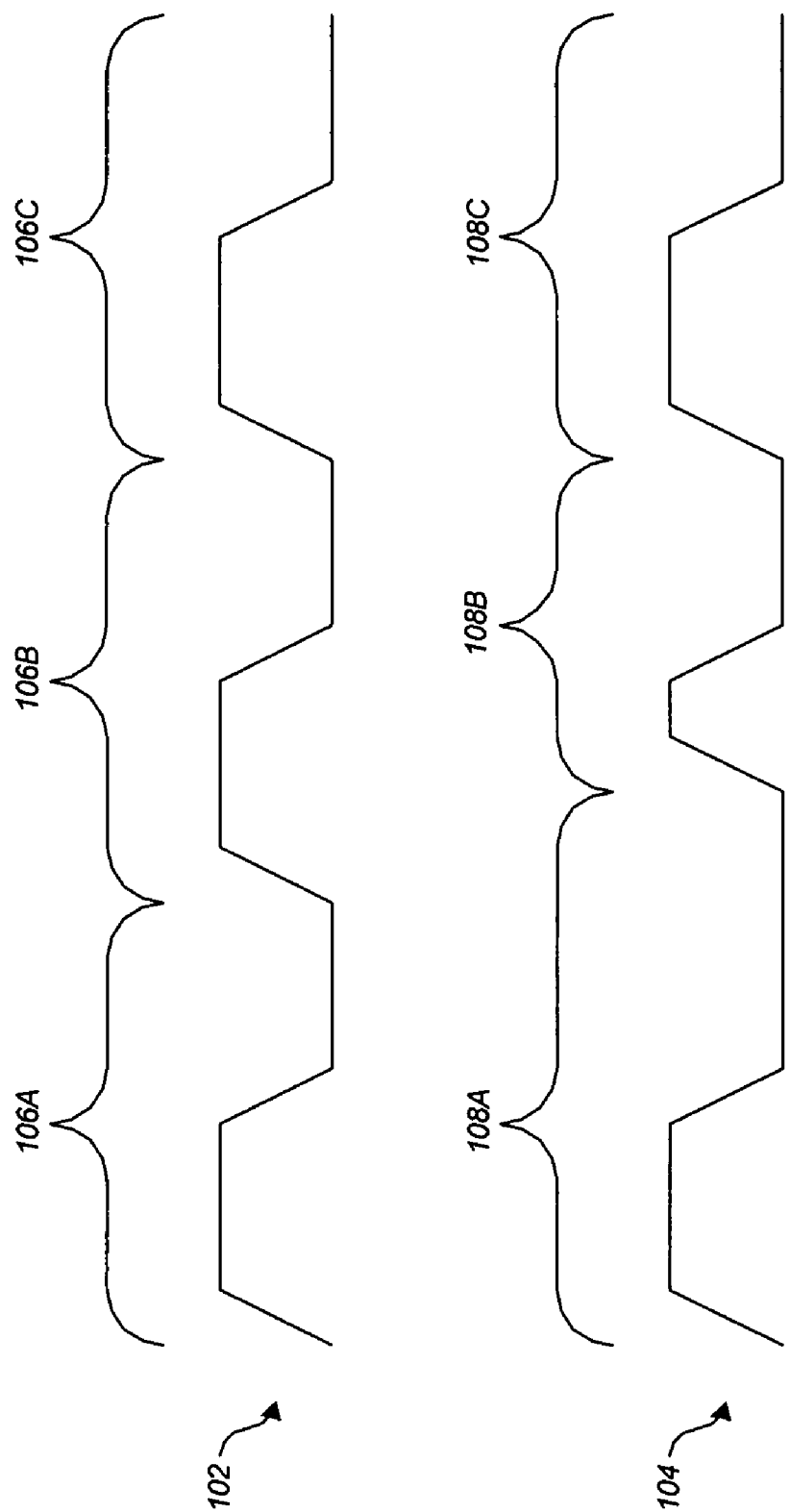
FIG. 1 shows a clock signal before and after modification according to a preferred embodiment.

The leading digit(s) of each reference numeral used in this specification indicates the number of the drawing in which the reference numeral first appears.

DETAILED DESCRIPTION

A particular integrated circuit has a maximum operational speed defined by a maximum operational clock rate. High operational speeds are highly desirable and are an important design requirement. Integrated circuits are commonly tested after production to ensure they operate properly at the advertised maximum clock rate. When an integrated circuit fails such a test, it is necessary to identify the portion of the circuit that failed to operate at the tested clock rate in order to fix the problem.

A circuit that fails to operate correctly at a high clock rate will, most likely, operate correctly at a lower clock rate. In a preferred embodiment of the present invention, the clock signal supplied to an integrated circuit under test is modified to simulate a higher clock rate during certain predetermined cycles of the clock signal in order to identify the portion of the integrated circuit that fails at that higher clock rate. FIG. 1 shows a clock signal before (102) and after (104) modification according to a preferred embodiment. Referring to FIG. 1, reference clock signal 102 comprises three clock cycles 106A, 106B, and 106C, each having the same duration. Reference clock signal 102 is modified to form test clock signal 104 by decreasing the duration of the second clock pulse, for example by delaying the occurrence of the leading edge of that clock pulse. This modification also reduces the duration of the second clock cycle 108b of clock signal 104, while increasing the duration of the first clock cycle 108a. The duration of the third clock cycle 108c of clock signal 104 is unchanged. Of course, when the duration of a clock cycle is decreased, the clock rate for that cycle increases correspondingly.

Embodiments of the present invention employ such test clock signals having higher clock rates for some clock cycles to isolate the portions of a circuit under test that fail to operate at those higher clock rates. Embodiments of the invention increase and decrease clock rates for predetermined clock cycles by delaying the occurrence of the rising and falling edges of the clock signal used to clock the circuit as described in detail below.

Figure 2:
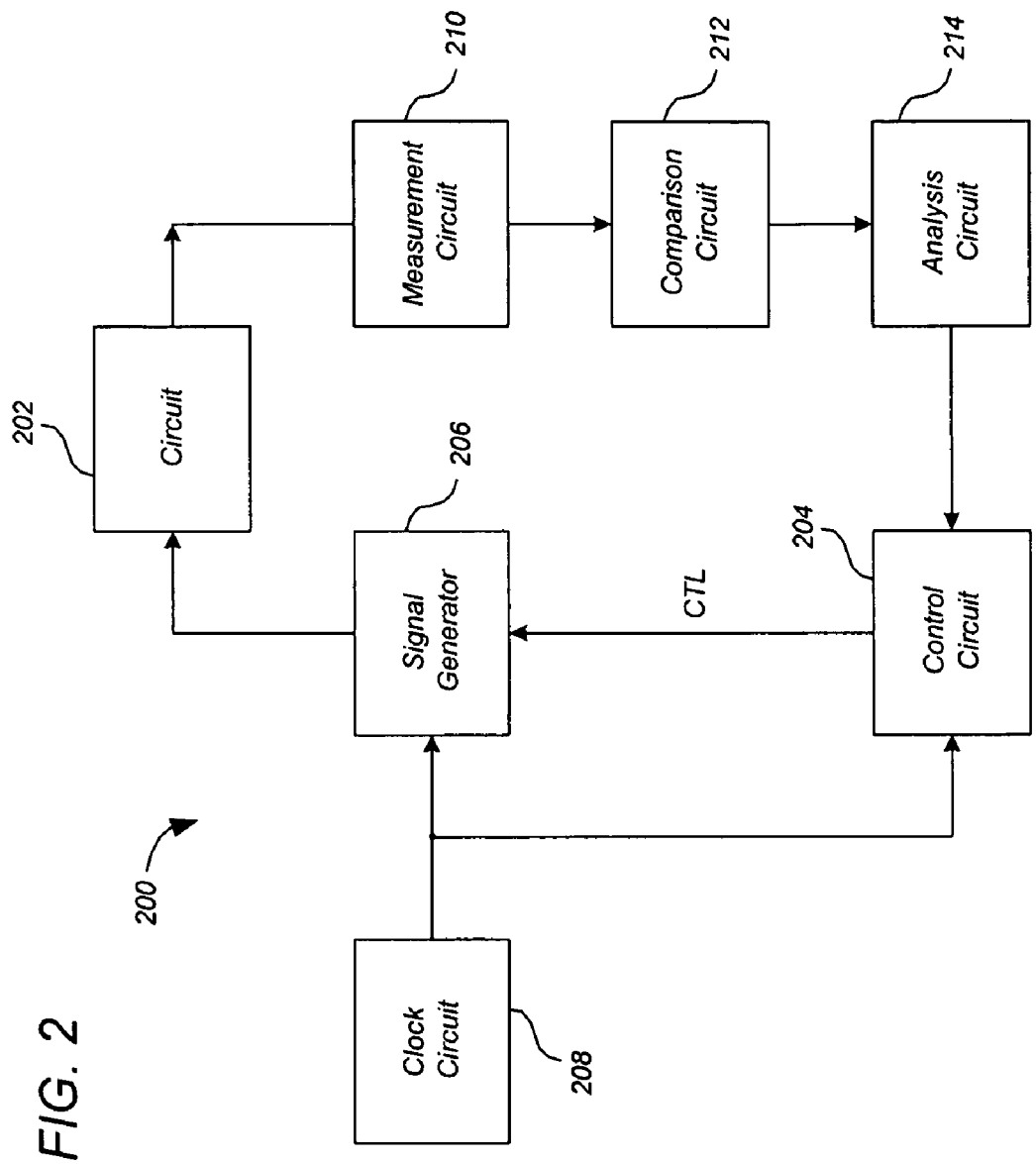
FIG. 2 shows a block diagram of an apparatus for testing an integrated circuit according to a preferred embodiment.

FIG. 2 shows a block diagram of an apparatus 200 for testing a circuit 202 according to a preferred embodiment. Apparatus 200 includes a control circuit 204, a signal generator 206, a clock circuit 208, a measurement circuit 210, a comparison circuit 212, and an analysis circuit 214. Preferably, circuit 202, control circuit 204, signal generator 206, clock circuit 208, and measurement circuit 210 are implemented together as a single integrated circuit. Of course, the circuits of FIG. 2 can be arranged into different physical configurations.

Preferably circuit 202 comprises a plurality of clocked storage elements such as flip-flops that are interconnected by a plurality of signal paths. Each signal path can include other circuit elements, including logic circuits and clocked storage elements. Each clocked storage element comprises a clock input to receive a clock signal. The clocked storage elements operate under the control of the clock signal, as is well-known in the relevant arts.

Figure 3:
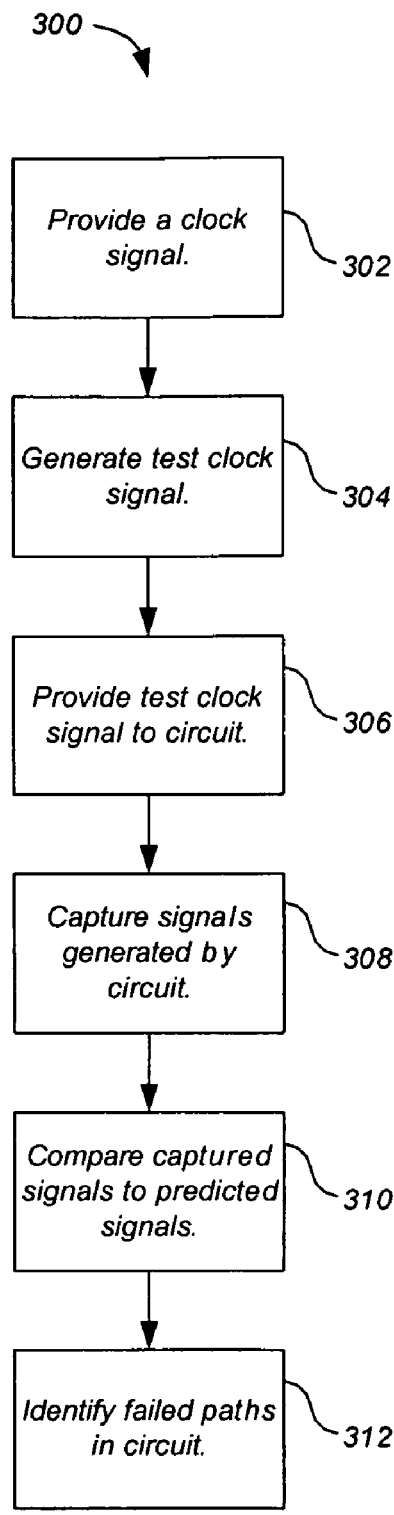
FIG. 3 shows a flowchart for a test process that can be executed by the apparatus of FIG. 2.

FIG. 3 shows a flowchart for a test process 300 that can be executed by apparatus 200. Clock circuit 208 provides a reference clock signal CLK comprising a plurality of pulses (step 302). Signal generator 206 modifies reference clock signal CLK according to a control signal CTL provided by control circuit 204, thereby producing a test clock signal TCLK (step 304), which is provided to circuit 202 (step 306). One or more signals provided by circuit 202 are captured by measurement circuit 210 (step 308). Comparison circuit 212 compares the captured signals to predicted signals (step 310). Analysis circuit 214 uses the results of the comparison to identify one or more failed paths in circuit 202 (step 312).

Figure 4:
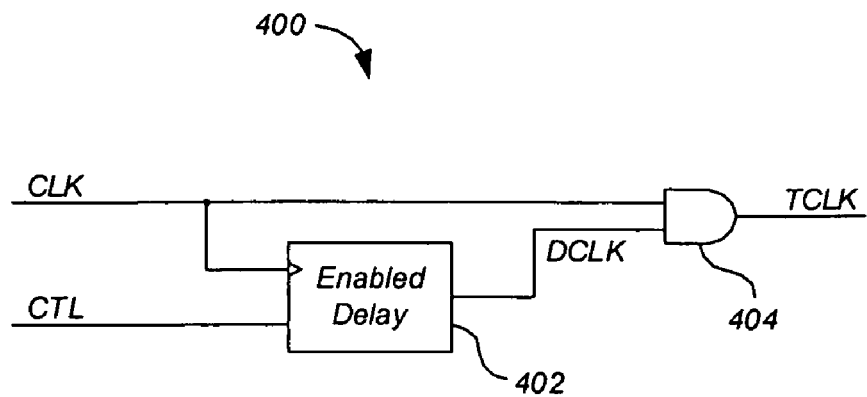
FIG. 4 shows a circuit that can serve as the signal generator of FIG. 2 according to a preferred embodiment.

FIG. 4 shows a circuit 400 that can serve as signal generator 206 of FIG. 2 according to a preferred embodiment. Circuit 400 includes an enabled delay circuit 402 and an AND gate 404. The reference clock signal CLK is provided to one input of AND gate 404 and to the input of enabled delay circuit 402.

The output of enabled delay circuit 402 is provided to the other input of AND gate 404. The output of AND gate 404 is the test clock signal TCLK. The enable input of enabled delay circuit 402 receives control signal CTL from control circuit 204.

Figure 5:
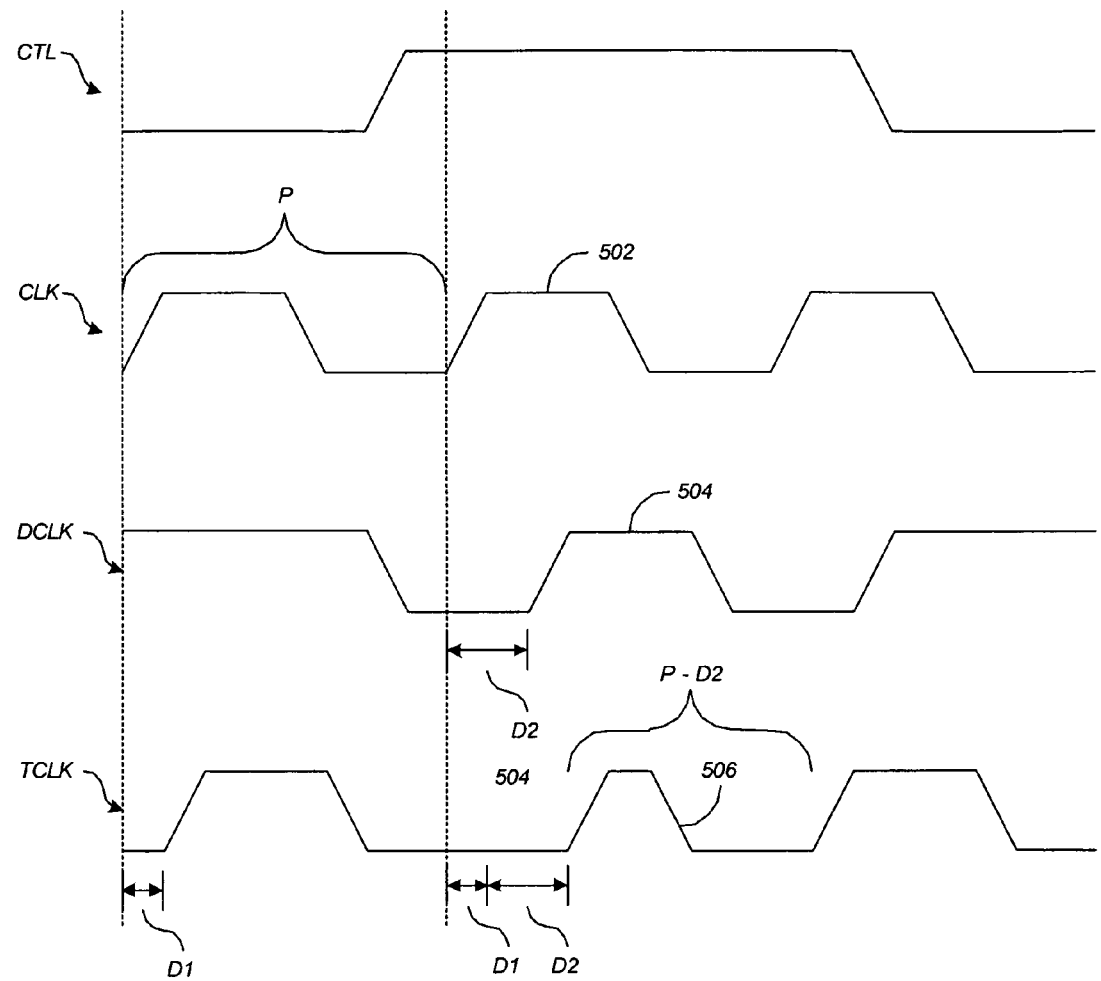
FIG. 5 shows a timing diagram of the signals of the circuit of FIG. 4.

FIG. 5 shows a timing diagram of the signals of circuit 400. Clock circuit 208 provides a reference clock signal CLK having a period P. When control signal CTL is low, the output of enabled delay circuit 402 is high, so that AND gate 404 simply outputs reference clock signal CLK with no modifications, subject only to the delay D1 imposed by AND gate 404. However, when control signal CTL is high, enabled delay circuit 402 outputs a delayed replica DCLK of signal CLK that is delayed by a predetermined delay D2. AND gate 404 combines signals CLK and DCLK to produce signal TCLK. Referring to FIG. 5, control signal CTL is high at the rising edge of the second pulse 502 of signal CLK, and so causes enabled delay circuit 402 to provide a delayed replica 504 of pulse 502. AND gate 404 combines pulses 502 and 504 to produce a narrow pulse 506 having a delayed rising edge and a consequently reduced cycle length of P−D2.

Figure 6:
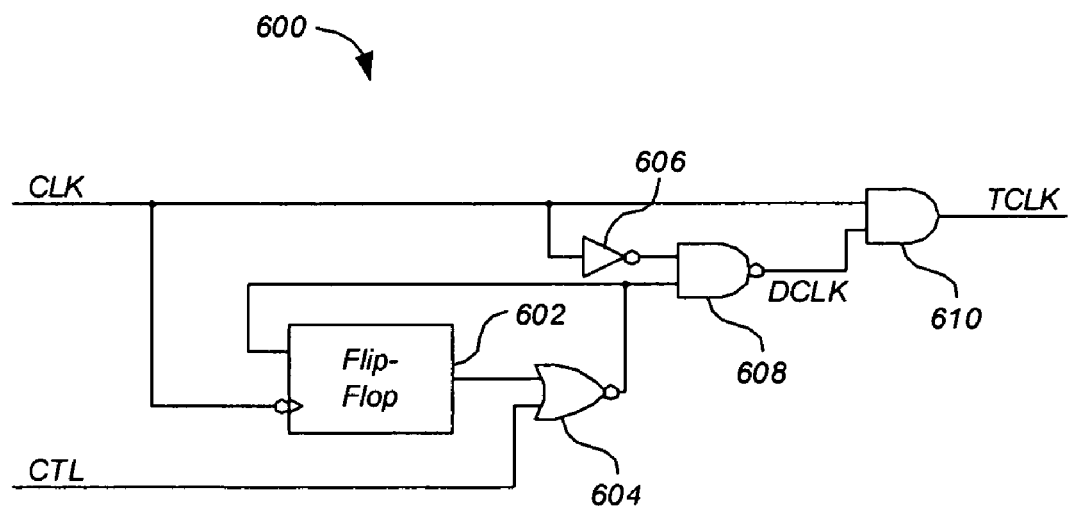
FIG. 6 shows a circuit that can serve as the signal generator of FIG. 2 according to a preferred embodiment.

FIG. 6 shows a circuit 600 that can serve as signal generator 206 of FIG. 2 according to a preferred embodiment. Circuit 600 comprises a flip-flop 602, a NOR gate 604, an inverter 606, NAND gate 608, and an AND gate 610. The input of flip-flop 602 receives the output of NOR gate 604, which receives the output of flip-flop 602 and control signal CTL. The clock input of flip-flop 602 receives an inverted version of clock signal CLK.

Inverter 606 receives clock signal CLK. NAND gate 608 receives the outputs of inverter 606 and NOR gate 604. AND gate 610 receives the output of NAND gate 608 (DCLK) and clock signal CLK. The output of AND gate 610 is test clock signal TCLK.

Figure 7:
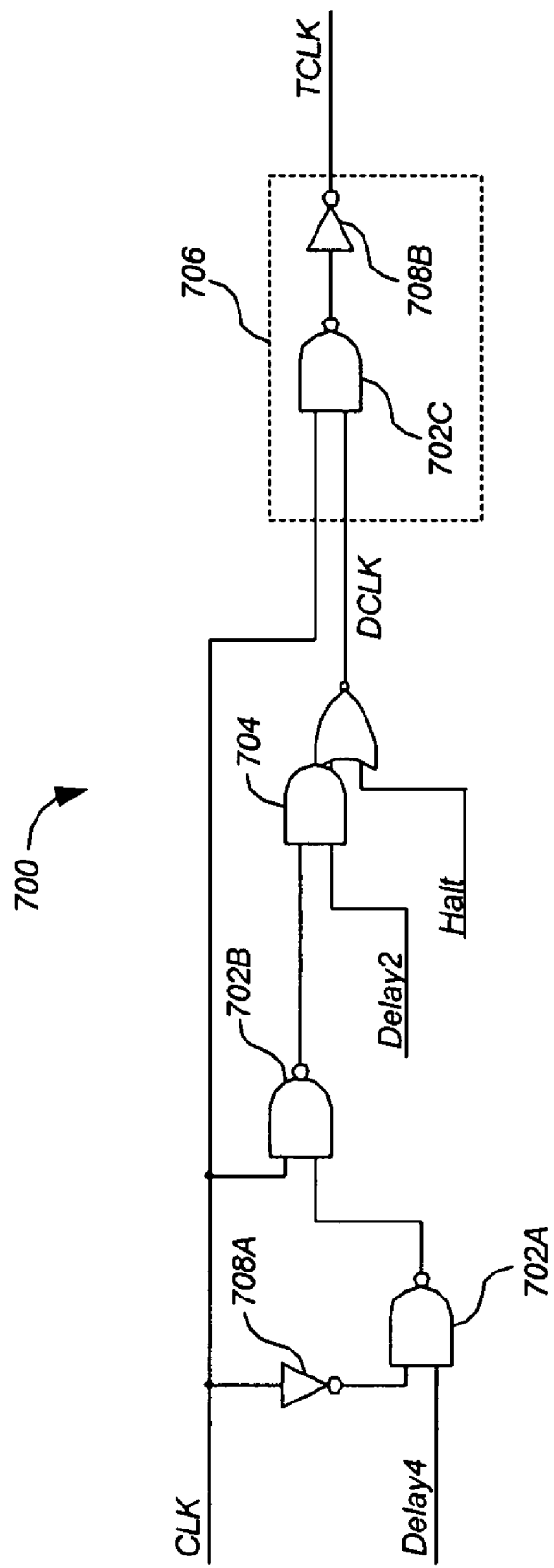
FIG. 7 shows a circuit that can serve as the signal generator of FIG. 2 and receives multiple control signals according to a preferred embodiment.

In some embodiments, control circuit 204 provides multiple control signals. FIG. 7 shows a circuit 700 that can serve as signal generator 206 of FIG. 2 and receives multiple control signals according to a preferred embodiment. Circuit 700 comprises NAND gates 702A and 702B, an ANDORInvert gate 704, inverter 708A, and balanced AND gate 706, which can be implemented as a NAND gate 702C and an inverter 708B.

NAND gate 702A receives signal CLK, inverted by inverter 708A, and a control signal Delay4. NAND gate 702B receives clock signal CLK and the output of NAND gate 702A. The AND inputs of ANDORInvert gate 704 receive the output of NAND gate 702B and a control signal Delay2. The OR input of ANDORInvert gate 704 receives the output of ANDORInvert gate 704 and a control signal Halt. NAND gate 702C receives the output of ANDORInvert gate 704 (DCLK) and clock signal CLK. Inverter 708B receives the output of NAND gate 702C. The output of inverter 708B is test clock signal TCLK.

Control signal Halt is used to suspend the test clock signal TCLK. When control signal Halt is high, clock signal TCLK is low, regardless of the states of the other control signals Delay2 and Delay4. When control signal Halt is low and control signals Delay2 and Delay4 are both low, circuit 700 provides an unmodified replica of clock signal CLK as signal TCLK. (Of course, signal TCLK is delayed relative to signal CLK by the two inverter delays imposed by balanced AND gate 706.)

Figure 8:
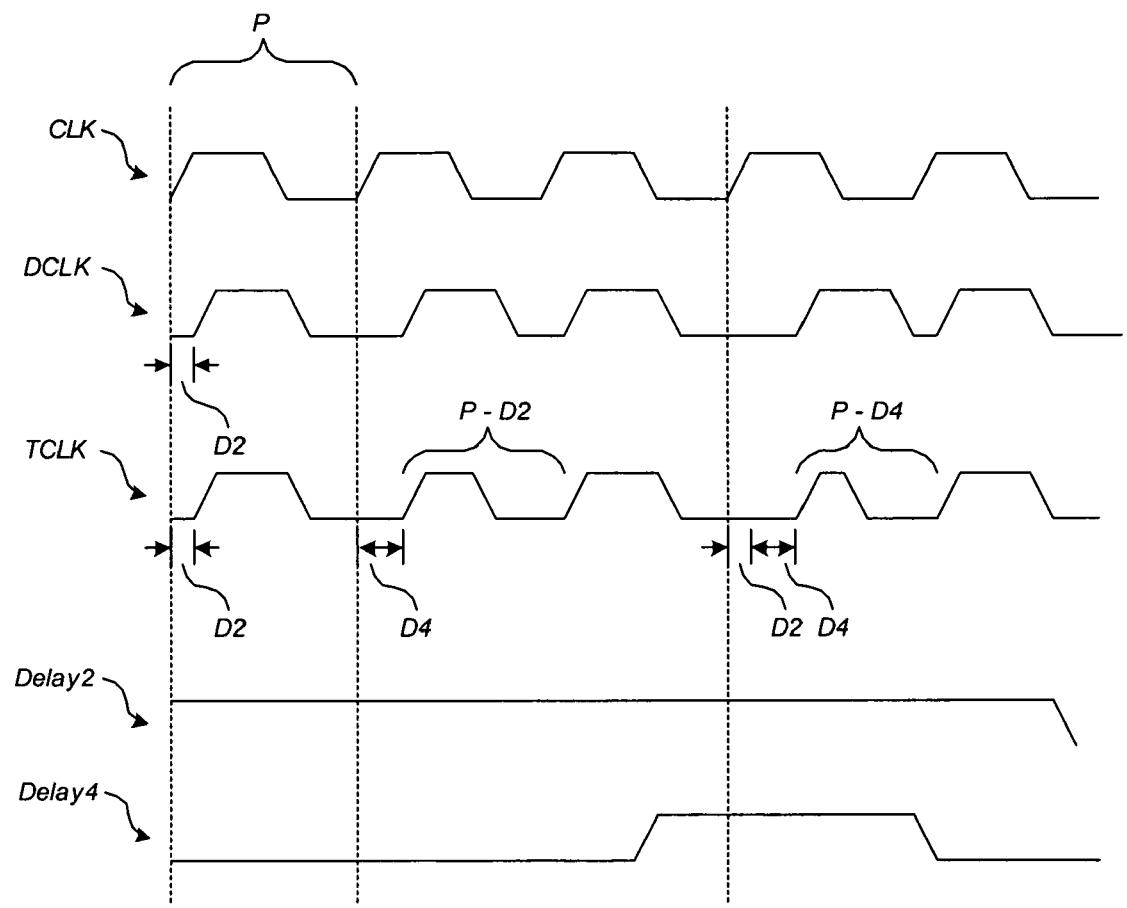
FIG. 8 shows a timing diagram of the signals of the circuit of FIG. 7.

FIG. 8 shows a timing diagram of the signals of circuit 700. Clock circuit 208 provides a clock signal CLK having a period P. When control signal Halt is low, control signal Delay2 is high, and control signal Delay4 is low, the rising edges of clock signal DCLK are delayed by 2 inverter delays (D2) relative to the corresponding rising edges of clock signal CLK, as shown in FIG. 8. Therefore, the rising edges of clock signal TCLK are delayed by 4 inverter delays relative to the corresponding rising edges of clock signal CLK, and the falling edges of clock signal TCLK are delayed by 2 inverter delays relative to the corresponding falling edges of clock signal CLK. (The additional two inverter delays are imposed by balanced AND gate 706.) Therefore test clock signal TCLK has a reduced duty cycle and a period of P−D2. This operation is useful to stress every other clock cycle. Such an operation can be employed in the test process described below with reference to FIG. 10.

When control signal Halt is low and control signals Delay2 and Delay4 are high, the rising edges of clock signal DCLK are delayed by 4 inverter delays (D4) relative to the corresponding rising edges of clock signal CLK, as shown in FIG. 8. Therefore, the rising edges of clock signal TCLK are delayed by 6 inverter delays relative to the corresponding rising edges of clock signal CLK, and the falling edges of clock signal TCLK are delayed by 2 inverter delays relative to the corresponding falling edges of clock signal CLK. (The additional two inverter delays are imposed by balanced AND gate 706.) Therefore the period of the resulting clock cycle in test clock signal TCLK clock is P−D4. This operation can be used to stress a predetermined individual clock cycles by keeping control signal Delay2 high, and making control signal Delay 4 high only during the predetermined clock cycle. Such an operation can be employed in the test process described below with reference to FIG. 10.

While circuit 700 receives only two control signals, and can shift a rising edge by only 2 or 4 inverter delays, additional gates can be added to accommodate further control signals for imposing other amounts of delay upon clock signal CLK. For example, instead of receiving clock signal CLK inverted by inverter 708A, NAND gate 702A could instead receive the output of a further NAND gate, which receives as inputs clock signal CLK, inverted by an inverter, and a further control signal Delay6 which, when asserted, would impose a 6 inverter delay upon clock signal CLK. Additional delays and control signals can be implemented in a similar manner, as will be apparent to one skilled in the relevant arts after reading this description.

Figure 9:
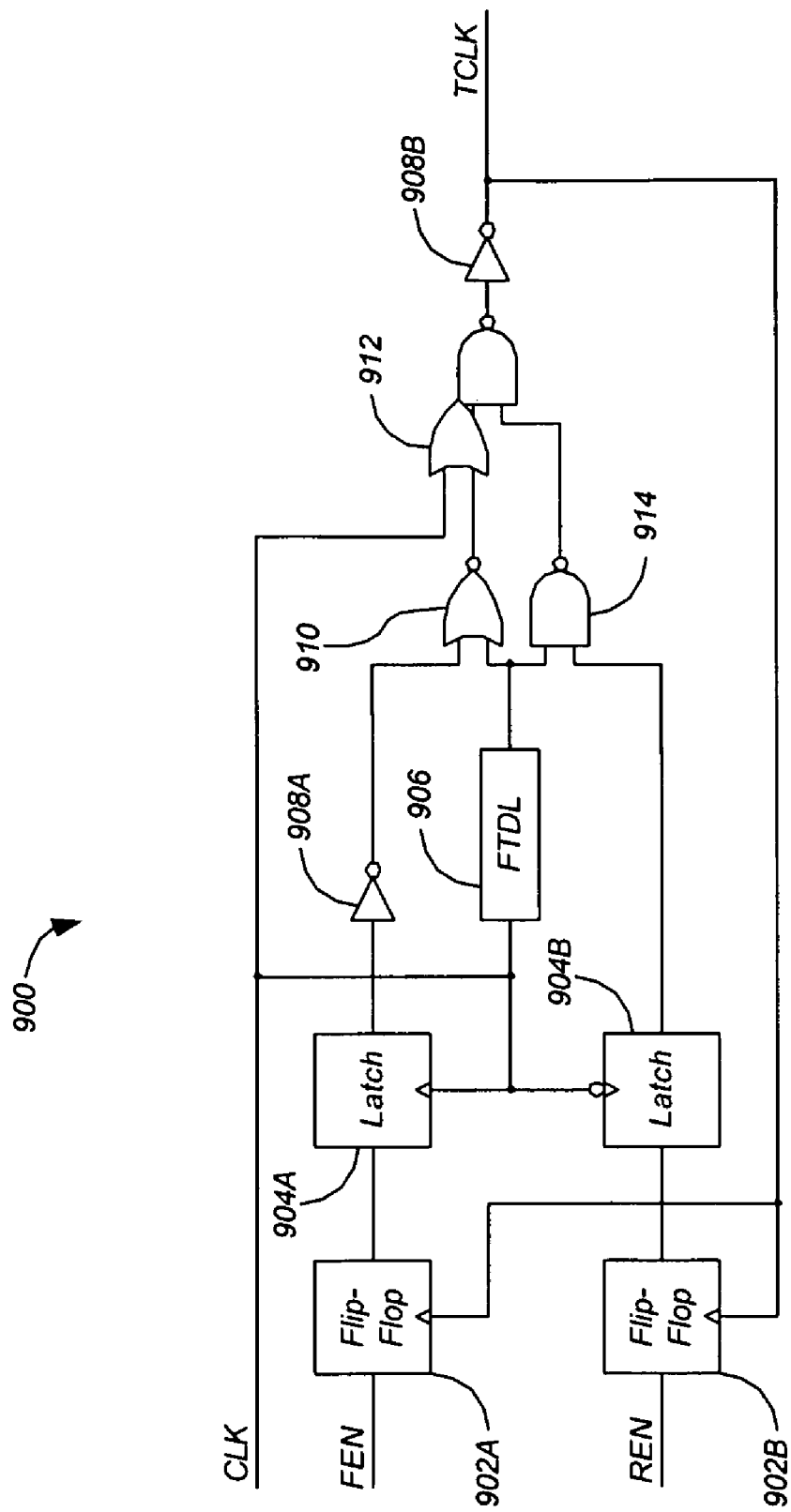
FIG. 9 shows a circuit that can serve as the signal generator of FIG. 2 and can delay the rising and falling edges of clock signal CLK according to a preferred embodiment.

While in conventional integrated circuits, most signal paths connect storage devices that are triggered by the rising edge of a clock signal, other signal paths may connect storage devices that are triggered by the falling edge of the clock signal. FIG. 9 shows a circuit 900 that can serve as signal generator 206 of FIG. 2 and can delay the rising and falling edges of clock signal CLK according to a preferred embodiment.

Circuit 900 comprises flip-flops 902A and 902B, latches 904A and 904B, fine tune delay line (FTDL) 906, inverters 908A and 908B, NOR gate 910, ORANDInvert gate 912, and NAND gate 914

Flip-flops 902A and 902B are clocked by clock signal TCLK, and receive control signals FEN and REN, respectively, from control circuit 204. Latches 904A and 904B are clocked by un-inverted and inverted versions, respectively, of clock signal CLK, and receive the outputs of flip-flops 902A and 902B, respectively. FTDL 906 receives clock signal CLK. NOR gate 910 receives the output of latch 904A, inverted by inverter 908A, and the output of FTDL 906. NAND gate 914 receives the output of latch 904B and the output of FTDL 906. The OR inputs of ORANDInvert gate 912 receive clock signal CLK and the output of NOR gate 910. The AND input of ORANDInvert gate 912 receives the output of NAND gate 914. Inverter 908B inverts the output of ORANDInvert gate 912 to produce clock signal TCLK.

When asserted, control signal FEN causes circuit 900 to delay the falling edges of clock signal CLK by a delay set by FTDL 906. Similarly, control signal, REN, when asserted, causes circuit 900 to delay the rising edges of clock signal CLK by the delay set by FTDL 906. Of course, other circuit variations are contemplated. For example, the delay imposed by FTDL 906 can be controlled during operation by a further control signal provided by control circuit 202, so that different delays can be imposed for the rising and falling edges, and for different ones of the edges.

Figure 10:
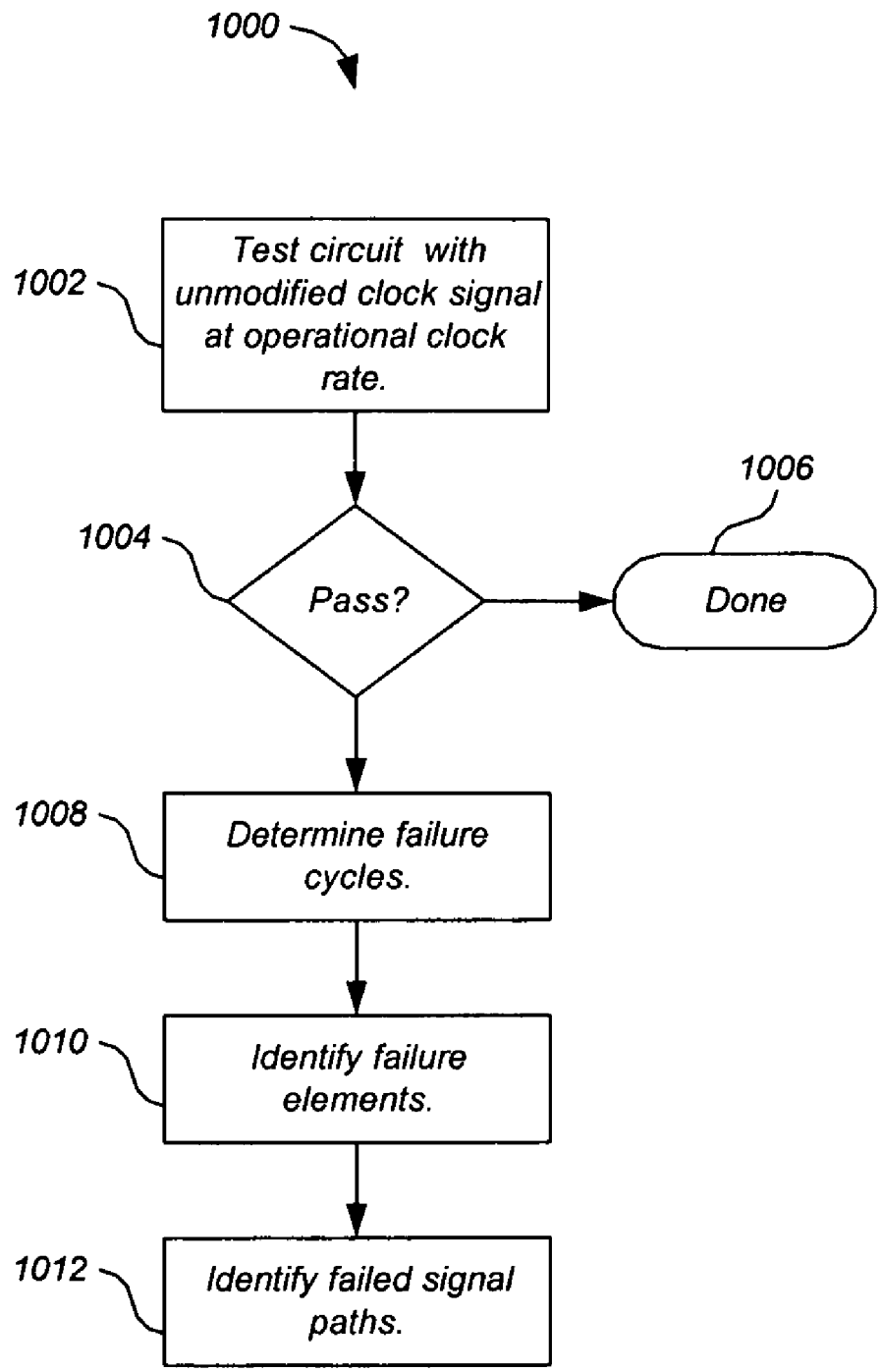
FIG. 10 shows a flowchart of a process for testing the circuit of FIG. 2 that can be performed by the apparatus of FIG. 2 according to a preferred embodiment.

FIG. 10 shows a flowchart of a process 1000 for testing circuit 202 of FIG. 2 that can be performed by apparatus 200 of FIG. 2 according to a preferred embodiment. Process 1000 tests circuit 202. If circuit 202 fails, process 1000 first identifies the clock cycle (or cycles) during which the failure occurs using a process of elimination by reducing the duration of predetermined clock cycles, effectively increasing the clock rate of those cycles. Then process 1000 identifies the signal paths in circuit 202 responsible for the failure by examining the contents of the storage elements in the temporal vicinity of the identified clock cycles. Once the failed signal paths are known, the design of circuit 202 can be corrected rapidly and tested again.

In a preferred embodiment, process 1000 shortens a clock cycle by decreasing the duration of one of the pulses constituting that clock cycle, for example by delaying the occurrence of a rising or falling edge of that pulse as described above.

Process 1000 first tests circuit 202 with an unmodified clock signal at an operational clock rate (step 1002). An operational clock rate is selected at which circuit 202 operates correctly. Pushing circuit 202 to higher performance is done through shortening individual clock cycles produced by signal generator 206, and observing which cycle can not perform at the shorter cycle time. Clock circuit 208 provides clock signal CLK to signal generator 206 at the selected operational clock rate. Control circuit 204 provides one or more control signals CTL to signal generator 206, causing signal generator 206 to pass clock signal CLK with no modifications to circuit 202 as clock signal TCLK. Measurement circuit 210 collects and measures the signals generated by circuit 202 in response to clock signal TCLK.

In a preferred embodiment the storage elements in circuit 202 define one or more scan chains. That is, in response to a control signal, the storage elements in circuit 202 interconnect such that test data can be loaded into, or extracted from, the storage elements, as is well-known in the relevant arts. Thus in a preferred embodiment, the signals measured by measurement circuit 210 are the contents of the storage elements of circuit 202, which are read by causing the storage elements to form one or more scan chains, and then shifting the contents of the storage elements through the scan chains from circuit 202 to measurement circuit 210.

Comparison circuit 212 compares the signals to predicted signals to obtain a test result. In a preferred embodiment using scan chains, comparison circuit 212 compares the values stored in the storage elements in circuit 202 to predicted values.

Analysis circuit 214 identifies one of the signal paths as flawed based on the test result, as described in detail below. If the measured values agree with the predicted values (step 1004), circuit 202 has passed the test, and the test concludes (step 1006). However, if any measured value does not agree with the corresponding predicted value, the test is repeated using modified clock signals to determine the clock cycle during which circuit 202 fails (step 1008), as described above in detail.

Figure 11:
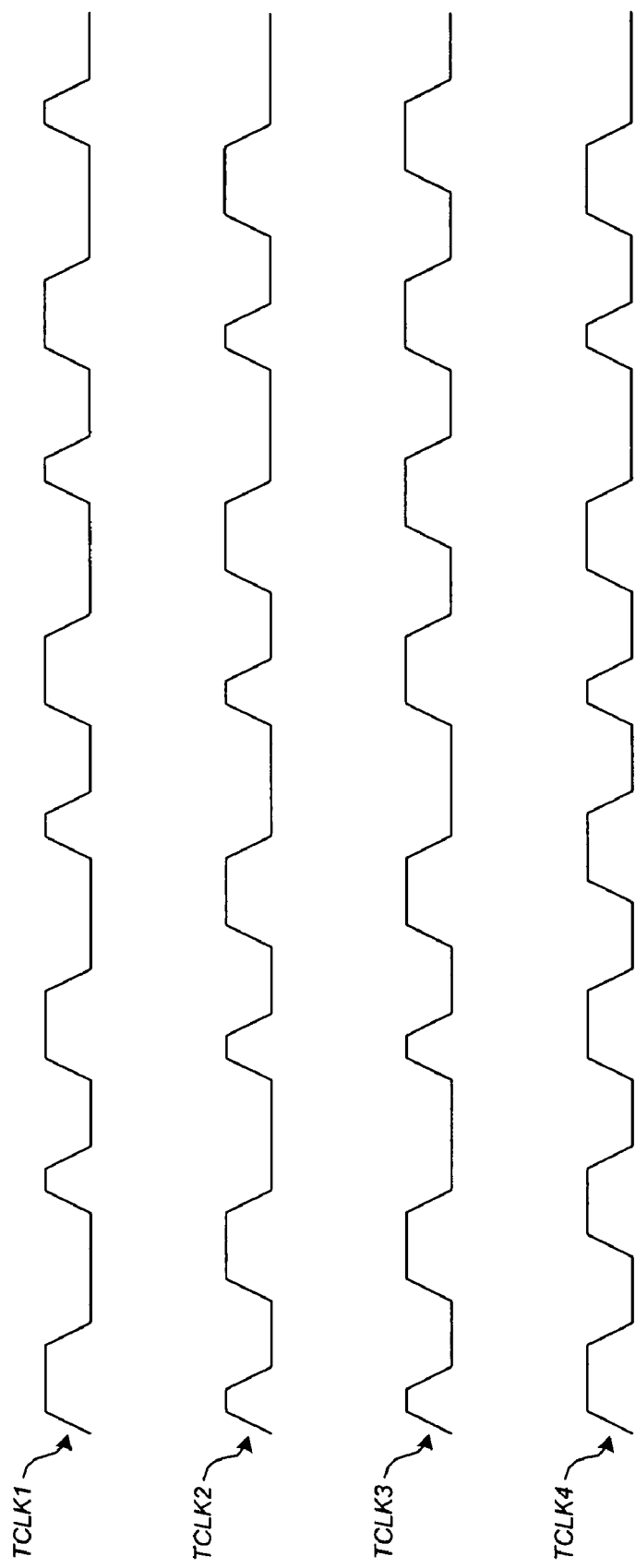
FIG. 11 shows modified clock signals for a test time having 8 cycles.

FIG. 11 shows the modified clock signals for a test time having 8 cycles. In a preferred embodiment, control circuit 204 first causes signal generator 206 to modify clock signal CLK to reduce the duration of every even clock cycle (that is, clock cycles 2, 4, 6, and so on) so that the even clock cycles have a duration that is less than the duration of the odd clock cycles (that is, clock cycles 1, 3, 5, and so on). The resulting clock signal is shown as TCLK1 in FIG. 11.

In a preferred embodiment, the clock rate of the shortened clock cycles (here, the even clock cycles) corresponds to the operational clock rate that caused circuit 202 to fail, and the clock rate of the unmodified clock cycles (here, the odd clock cycles) corresponds to a lower clock rate at which circuit 202 operates properly. When circuit 202 fails in response to such a modified clock signal, it is clear that the fault is the result of one of the shortened clock cycles.

Signal generator 206 applies clock signal TCLK1 to circuit 202. If circuit 202 fails the test, then a fault occurs during one of the even cycles of clock signal TCLK1.

Next control circuit 204 causes signal generator 206 to modify clock signal CLK to reduce the duration of every odd clock cycle so that the odd clock cycles have a duration that is less than the duration of the even clock cycles. The resulting clock signal is shown as TCLK2 in FIG. 11.

In a preferred embodiment, the clock rate of the shortened clock cycles (here, the odd clock cycles) corresponds to the operational clock rate that caused circuit 202 to fail, and the clock rate of the unmodified clock cycles (here, the even clock cycles) corresponds to a lower clock rate at which circuit 202 operates properly.

Signal generator 206 applies clock signal TCLK2 to circuit 202. If circuit 202 fails the test, then a fault occurs during one of the odd cycles of clock signal TCLK2.

While in a preferred embodiment, process 1000 shortens even and odd clock cycles, other variations are contemplated. For example, process 1000 can decrease the duration of every nth cycle of the signal to produce the test clock signal, and successively apply the test clock signal at n different predetermined phases to the clock inputs of the clocked storage elements, wherein each of the predetermined phases is offset from another of the predetermined phases by a period of the test clock signal.

With only a single fault then, process 1000 has eliminated half of the clock cycles at this point. The remainder of this description assumes that circuit 202 operated properly in response to clock signal TCLK1, but failed in response to clock signal TCLK2. Therefore the fault occurs during an odd clock cycle, which is referred to herein as the "failure phase" of the clock signal for circuit 202.

Next process 1000 examines different portions of the test time (that is, the period of time during which circuit 202 is tested) using the failure phase of the clock signal. Preferably process 202 conducts a binary search of the test time, although other types of searches are contemplated. Process 1000 applies a test clock signal (shown as TCLK3 in FIG. 11) that comprises the failure phase of the clock signal during the first half of the test time, and the unmodified clock signal during the second half of the test time. If circuit 202 fails, the fault occurs during a clock cycle in the first half of the test time.

Then process 1000 applies a clock signal (shown as TCLK4 in FIG. 11) that comprises the unmodified clock signal during the first half of the test time, and the failure phase of the clock signal during the second half of the test time. If circuit 202 fails, the fault occurs during a clock cycle in the second half of the test time.

With a single fault, circuit 202 will fail during only one half of the test time. For example, assume circuit 202 fails in response to signal TCLK4. Thus the fault occurs during the second half of the test time. Then process 1000 examines the two halves of the second half of the test time using similar signals. Preferably process 1000 repeats this process until a single clock cycle is identified as the "failure cycle" during which a fault occurs. Of course, there may be multiple faults. With multiple faults, preferably, process 1000 locates the fault that occurs earliest during the test time, because all subsequent cycles are corrupted by the fault.

While for clarity process 1000 has been described for a circuit 202 having only a single fault, process 1000 is easily modified to identify multiple faults, as will be apparent to one skilled in the relevant arts after reading this description.

Once the failure cycle has been identified, process 1000 identifies the storage elements nearest the fault (step 1010), which are referred to herein as "failure elements." In a preferred embodiment, signal generator 206 applies clock signal CLK, unmodified and at the operational clock rate, to circuit 202, but stops the test at the failure cycle, for example by asserting the Halt signal in circuit 700 of FIG. 7. This clock signal is shown as signal TCLK5 in FIG. 11.

Measurement circuit 210 extracts the contents of the storage elements of circuit 202, preferably using scan chain technology as described above. Comparison circuit 212 compares the measured values to predicted values. Analysis circuit 214 identifies one or more failure elements in circuit 202, based on the comparison, where the measured values do not agree with the predicted values. Based on the design of circuit 202, analysis circuit 214 then identifies the paths connected to the failed storage element as failed signal paths (step 1012).

In a preferred embodiment, process 1000 goes on to examine storage elements in the "logic cone" of the failed storage element (that is, storage elements connected directly or indirectly to the input of the failed storage element) by repeating the test and stopping the clock signal TCLK one or more cycles before the failure cycle, and examining the contents of those storage elements at that time to reduce the number of signal paths suspected of failure and to identify other possible failed signal paths.

Figure 12:
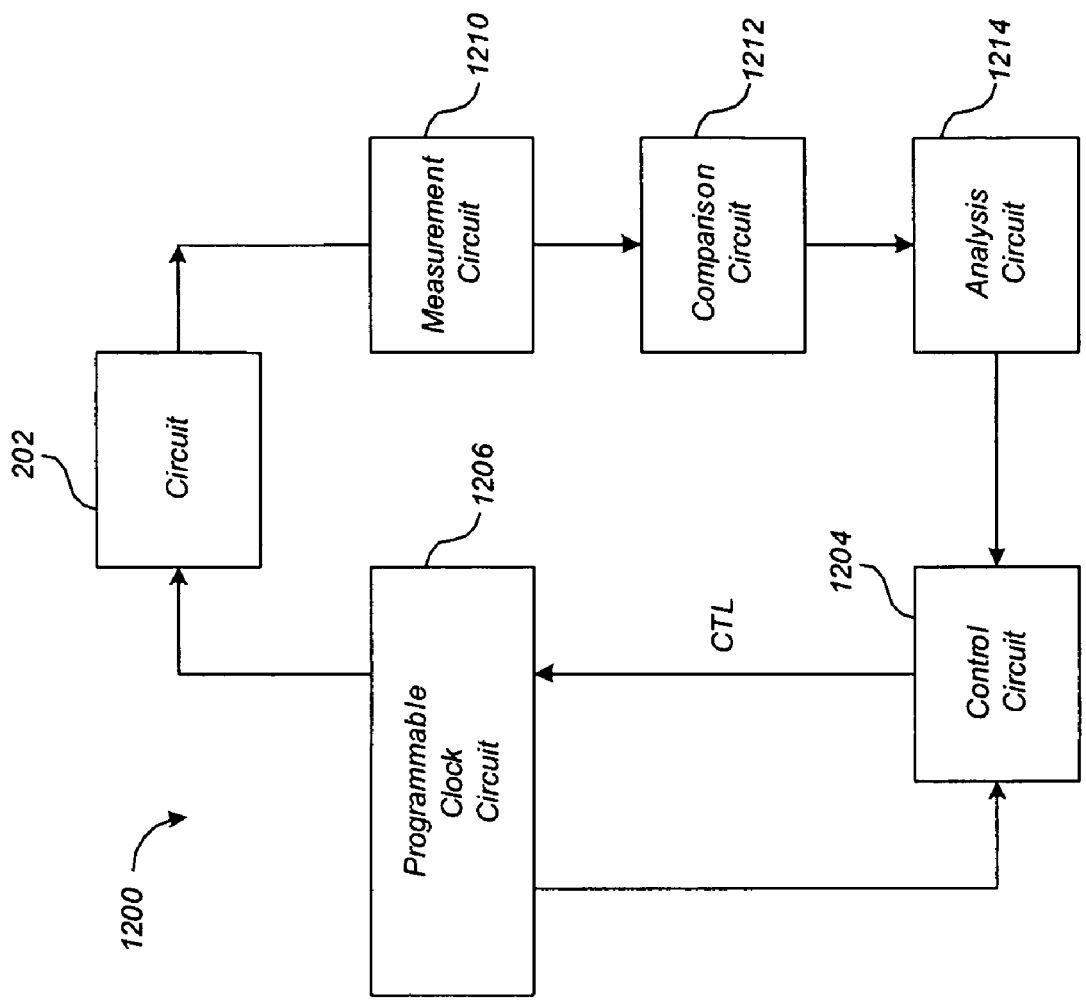
FIG. 12 shows a block diagram of an apparatus for testing the integrated circuit of FIG. 2 according to another preferred embodiment.

FIG. 12 shows a block diagram of an apparatus 1200 for testing integrated circuit 202 according to another preferred embodiment. Apparatus 1200 includes a control circuit 1204, a programmable clock circuit 1206, a measurement circuit 1210, a comparison circuit 1212, and an analysis circuit 1214. Of course, the circuits of FIG. 12 can be arranged into different physical configurations. Preferably circuit 202, control circuit 1204, programmable clock circuit 1206, and measurement circuit 1210 are implemented together as a single integrated circuit. In contrast to apparatus 200 of FIG. 2, apparatus 1200 does not modify an existing clock signal, but rather generates the test signals TCLK.

Figure 13:
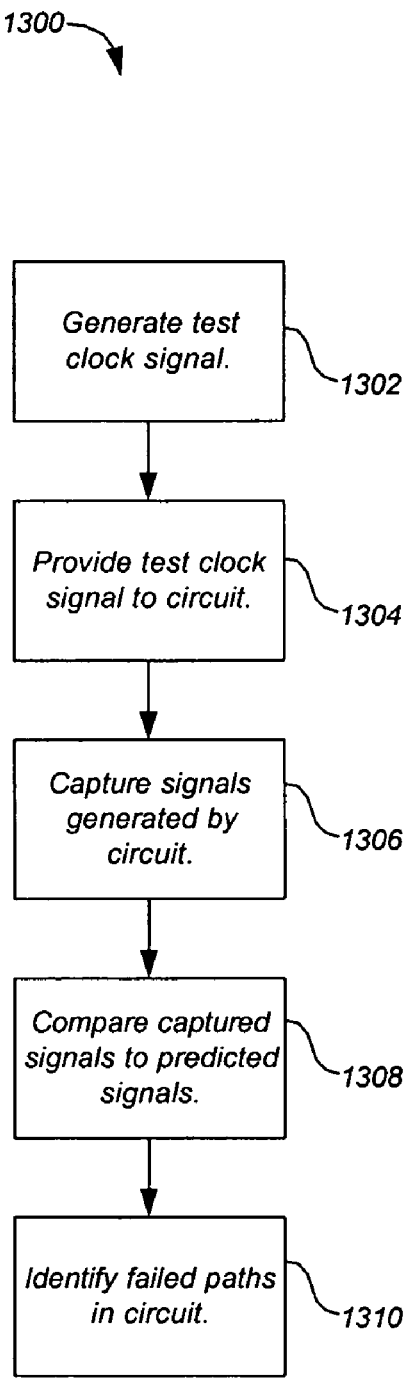
FIG. 13 shows a flowchart for a test process that can be executed by the apparatus of FIG. 12.

FIG. 13 shows a flowchart for a test process 1300 that can be executed by apparatus 1200. Process 1300 generates test clock signal TCLK (step 1302) according to a control signal CTL provided by control circuit 1204. Test clock signal TCLK comprises k pulses including j pulses each having a first duration and m pulses having a second duration, where k=m+j, and where the second duration is not substantially equal to the first duration. Process 1300 applies the test clock signal to the clock inputs of the plurality of clocked storage elements (step 1304). One or more signals provided by circuit 202 are captured by measurement circuit 1210 (step 1306). Comparison circuit 1212 compares the captured signals to predicted signals (step 1308). Analysis circuit 1214 uses the results of the comparison to identify one or more failed paths in circuit 202 (step 1310).

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. Accordingly, other implementations are within the scope of the following claims.

What is claimed is:

1. An integrated circuit comprising:
    a test signal generator that receives a clock signal including pulses having leading edges and trailing edges that occur at predetermined intervals and that selectively generates a modified clock signal by adjusting timing of at least one of the leading and trailing edges of at least one of the pulses;
    a signal path that includes a circuit and that receives one of the clock signal and the modified clock signal from the test signal generator; and
    an analysis circuit that selectively identifies the signal path as flawed based on the adjusted timing.

2. The integrated circuit of claim 1 wherein the test signal generator adjusts timing by one of delaying timing of at least one of the leading edges and advancing timing of at least one of the trailing edges.

3. The integrated circuit of claim 1 wherein the circuit comprises a clocked storage element including a clock input that receives one of the clock signal and the modified clock signal.

4. The integrated circuit of claim 1 further comprising a control circuit that provides a control signal, wherein the test signal generator selects the one of the clock signal and the modified clock signal to output based on the control signal.

5. The integrated circuit of claim 1 wherein the test signal generator generates the modified clock signal by adjusting timing of at least one of the leading and trailing edges of at least one of the pulses of the clock signal without adjusting the timing of leading and trailing edges of at least one other pulse of the clock signal.

6. The integrated circuit of claim 1 wherein the test signal generator one of shortens and lengthens an interval between successive leading edges by adjusting timing of at least one of the leading edges.

7. The integrated circuit of claim 1 wherein the test signal generator one of shortens and lengthens an interval between successive trailing edges by adjusting timing of at least one of the trailing edges.

8. An integrated circuit comprising:
   a test signal generator that receives a clock signal including pulses having leading edges and trailing edges that occur at predetermined intervals and that selectively generates a modified clock signal by adjusting timing of at least one of the leading and trailing edges of at least one of the pulses;
   a signal path that includes a circuit and that receives one of the clock signal and the modified clock signal from the test signal generator;
   a measurement circuit that receives first and second outputs of the signal path generated during the clock signal and the modified clock signal, respectively;
   a comparing circuit that compares the first and second outputs; and
   an analysis circuit that selectively identifies the signal path as flawed based on the comparison.

9. An integrated circuit comprising:
   a test signal generator that receives a clock signal and that outputs one of the clock signal and a modified clock signal,
   wherein the test signal generator generates the modified clock signal based on a control signal, the clock signal and a delayed clock signal, and
   wherein the modified clock signal has a pulse rate that is the same as the clock signal and at least one pulse of the modified clock signal has a pulse duration that is shorter than a pulse duration of pulses of the clock signal;
   at least one signal path including a circuit that receives one of the clock signal and the modified clock signal from the test signal generator; and
   an analysis circuit that selectively identifies the signal path as flawed based on the at least one pulse.

10. The integrated circuit of claim 9 wherein the circuit comprises a clocked storage element including a clock input that receives the clock signal and the modified clock signal.

11. The integrated circuit of claim 9 further comprising a control circuit that provides the control signal.

12. A system comprising the integrated circuit of claim 9 and further comprising a clock circuit that provides the clock signal.

13. The integrated circuit of claim 9 wherein the test signal generator generates the modified clock signal by adjusting timing of at least one of the leading and trailing edges of at least one of the pulses of the clock signal without adjusting the timing of leading and trailing edges of a least one other pulse of the clock signal.

14. The integrated circuit of claim 9 wherein the test signal generator one of shortens and lengthens an interval between successive leading edges by adjusting timing of at least one of the leading edges.

15. The integrated circuit of claim 9 wherein the test signal generator one of shortens and lengthens an interval between successive trailing edges by adjusting timing of at least one of the trailing edges.

16. An integrated circuit comprising:
   a test signal generator that receives a clock signal and that outputs one of the clock signal and a modified clock signal,
   wherein the test signal generator generates the modified clock signal based on a control signal, the clock signal and a delayed clock signal, and
   wherein the modified clock signal has a pulse rate that is the same as the clock signal and at least one pulse of the modified clock signal has a pulse duration that is shorter than a pulse duration of pulses of the clock signal;
   at least one signal path including a circuit that receives one of the clock signal and the modified clock signal from the test signal generator;
   a measurement circuit that receives first and second outputs of the signal path based on the clock signal and the modified clock signal, respectively;
   a comparing circuit that compares the first and second outputs; and
   an analysis circuit that selectively identifies the signal path as flawed based on the comparison.

17. An integrated circuit comprising:
   a test signal generator that receives a clock signal including pulses having leading edges and trailing edges that occur at predetermined intervals and that selectively modifies the clock signal to adjust timing of at least one of the leading and trailing edges of at least one of the pulses;
   a signal path that includes a circuit and that receives the clock signal from the test signal generator; and
   an analysis circuit that selectively identifies the signal path as flawed based on the adjusted timing.

18. The integrated circuit of claim 17, further comprising:
   a measurement circuit that receives first and second outputs of the signal path generated while receiving the clock signal;
   a comparing circuit that compares the first and second outputs.

19. The integrated circuit of claim 17 wherein the test signal generator adjusts timing by one of delaying timing of at least one of the leading edges and advancing timing of at least one of the trailing edges.

20. The integrated circuit of claim 17 further comprising a control circuit that provides a control signal, wherein the test signal generator selectively modifies the clock signal based on the control signal.

* * * * *